United States Patent
Shen et al.

(10) Patent No.: US 7,851,896 B2
(45) Date of Patent: Dec. 14, 2010

(54) QUAD FLAT NON-LEADED CHIP PACKAGE

(75) Inventors: Geng-Shin Shen, Tainan County (TW); Chun-Ying Lin, Tainan County (TW); Shih-Wen Chou, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 154 days.

(21) Appl. No.: 12/201,236

(22) Filed: Aug. 29, 2008

(65) Prior Publication Data
US 2008/0315439 A1     Dec. 25, 2008

Related U.S. Application Data

(63) Continuation-in-part of application No. 11/302,736, filed on Dec. 13, 2005, now Pat. No. 7,436,074.

(30) Foreign Application Priority Data

Jul. 14, 2005     (TW) ............................... 94123850 A

(51) Int. Cl.
*H01L 23/495*     (2006.01)
*H01L 23/12*     (2006.01)

(52) U.S. Cl. ...................... 257/668; 257/701; 257/702; 257/782; 257/783; 257/784; 257/787; 257/E23.034; 257/E23.036; 257/E23.039

(58) Field of Classification Search ......... 257/780–787, 257/738, 668, 701, 702, 778, E23.001–E23.194
See application file for complete search history.

(56) References Cited

U.S. PATENT DOCUMENTS

| | | | | |
|---|---|---|---|---|
| 6,429,508 | B1 * | 8/2002 | Gang | 257/678 |
| 6,528,722 | B2 | 3/2003 | Huang et al. | 174/52.2 |
| 6,531,770 | B2 * | 3/2003 | Nakashima | 257/704 |
| 6,787,915 | B2 * | 9/2004 | Uchida et al. | 257/777 |
| 6,858,919 | B2 | 2/2005 | Seo et al. | 257/666 |
| 7,436,074 | B2 | 10/2008 | Pan et al. | 257/783 |

OTHER PUBLICATIONS

U.S. Office Action of U.S. Appl. No. 12/196,791, dated Jul. 30, 2009.

\* cited by examiner

*Primary Examiner*—Jasmine J Clark
(74) *Attorney, Agent, or Firm*—J.C. Patents

(57) ABSTRACT

A Quad Flat Non-leaded (QFN) chip package including a patterned conductive layer, a first solder resist layer, a chip, a plurality of bonding wires and a molding compound is provided. The patterned conductive layer has a first surface and a second surface opposite to each other. The first solder resist layer is disposed on the first surface, wherein a part of the first surface is exposed by the first solder resist layer. The chip is disposed on the first solder resist layer, wherein the first solder resist layer is between the patterned conductive layer and the chip. The bonding wires are electrically connected to the chip and the patterned conductive layer exposed by the first solder resist layer. The molding compound encapsulates the pattern conductive layer, the first solder resist layer, the chip and the bonding wires.

13 Claims, 11 Drawing Sheets

QUAD FLAT NON-LEADED CHIP PACKAGE

CROSS-REFERENCE TO RELATED APPLICATION

This is a continuation-in-part application of patent application Ser. No. 11/302,736 filed on Dec. 13, 2005, now U.S. Pat. No. 7,436,074, which claims the priority benefit of Taiwan patent application serial no. 94123850, filed Jul. 14, 2005. The entirety of each of the above-mentioned patent applications is hereby incorporated by reference herein and made a part of this specification.

BACKGROUND OF THE INVENTION

1. Field of the Invention

The present invention relates to a chip package. More particularly, the present invention relates to a Quad Flat Non-leaded (QFN) chip package.

2. Description of Related Art

The semiconductor industries have bee highly developed. With the trends of electrification, electronic and semiconductor devices are widely used in the daily life, including entertainment, education, transportation and households. The design of the electrical products becomes more complex, smaller-sized, light-weight and humanized, in order to offer more convenience for the consumers. In the package structures, the leadframe is one of the most commonly used elements, applied in various package products. Based on the type of leadframes, the Quad Flat Packages (QFP) can be categorized as quad flat chip package with "I" lead (QFI), quad flat chip package with "J" lead (QFJ) and Quad Flat Non-leaded (QFN) chip package. Because leads of the leadframe in the QFN chip package end at the edges of the chip package structure, the QFN chip package has a small size. Since the QFN chip package provides shorter electrical path and faster signal transmission, the QFN chip package has been widely used as low pin count solutions for power elements.

In general, in the fabricating process of a QFN chip package, a plurality of chips are disposed on the leadframe, wherein the leadframe includes a plurality of lead sets connected to each other and each chip is surrounded by one lead set. Each chip is electrically connected to one lead set through wire bonding. Then, a molding compound is formed to encapsulate the leadframe, the chips and the bonding wires. Finally, a plurality of QFN chip packages are formed through a singulation process.

SUMMARY OF THE INVENTION

The present invention relates to a QFN chip package. More particularly, the present invention relates to a QFN chip package having small thickness.

As embodied and broadly described herein, the present invention provides a Quad Flat Non-leaded (QFN) chip package comprising a patterned conductive layer, a first solder resist layer, a chip, a plurality of bonding wires and a molding compound is provided. The patterned conductive layer has a first surface and a second surface opposite to each other. The first solder resist layer is disposed on the first surface, wherein a part of the first surface is exposed by the first solder resist layer. The chip is disposed on the first solder resist layer, wherein the first solder resist layer is between the patterned conductive layer and the chip. The bonding wires are electrically connected to the chip and the patterned conductive layer exposed by the first solder resist layer. The molding compound encapsulates the pattern conductive layer, the first solder resist layer, the chip and the bonding wires.

According to an embodiment of the present invention, wherein the chip has an active surface, a rear surface opposite to the active surface and a plurality of bonding pads disposed on the active surface, and the rear surface of the chip contacts with the first solder resist layer.

According to an embodiment of the present invention, the QFN chip package further comprises an adhesive layer disposed between the first solder resist layer and the chip.

As embodied and broadly described herein, the present invention provides another Quad Flat Non-leaded (QFN) chip package comprising a patterned conductive layer, a first solder resist layer, a chip, a plurality of bonding wires and a molding compound is provided. The patterned conductive layer has a first surface and a second surface opposite to each other. The first solder resist layer is disposed on the first surface, wherein a part of the first surface is exposed by the first solder resist layer. The chip is disposed on a portion of the first surface exposed by the first solder resist layer. The bonding wires are electrically connected to the chip and the patterned conductive layer exposed by the first solder resist layer. The molding compound encapsulates the pattern conductive layer, the first solder resist layer, the chip and the bonding wires.

According to an embodiment of the present invention, the patterned conductive layer comprises a die pad and a plurality of leads surrounding the die pad.

According to an embodiment of the present invention, the first solder resist layer extends from the first surface of the patterned conductive layer to the area between the die pad and the leads.

According to an embodiment of the present invention, the QFN chip package further comprises a second solder resist layer disposed between the die pad and the leads without contacting with the first solder resist layer.

According to an embodiment of the present invention, the chip has an active surface, a rear surface opposite to the active surface and a plurality bonding pads disposed on the active surface, and the rear surface of the chip contacts with the first surface of the patterned conductive layer.

According to an embodiment of the present invention, the QFN chip package further comprises an adhesive layer disposed between the patterned conductive layer and the chip.

According to an embodiment of the present invention, the adhesive layer comprises a B-staged adhesive layer.

In summary, the QFN chip package of the present invention has a solder resist layer to enhance the structure strength of the QFN chip package, such that the thickness of the patterned conductive layer can be decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
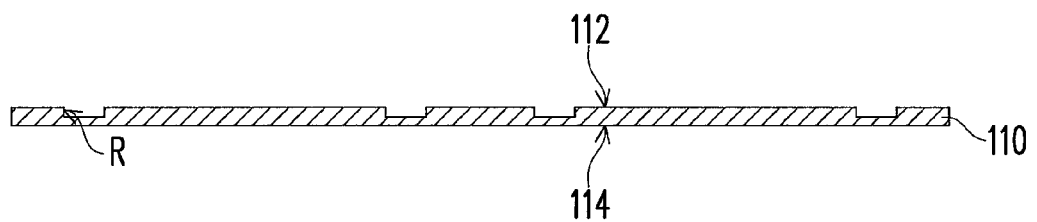
FIG. 1A to FIG. 1G are cross-sectional views schematically illustrating the manufacturing process of the QFN chip package according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

The First Embodiment

FIG. 1A to FIG. 1G are cross-sectional views schematically illustrating the manufacturing process of the QFN chip package according to the first embodiment of the present invention. Referring to FIG. 1A, a conductive layer 110 having a first surface 112 and a second surface 114 is provided. Then, the conductive layer 110 at predetermined regions is partially removed such that a plurality of recesses R are formed on the first surface 112 of the conductive layer 110. In the present embodiment, the recesses R on the first surface 112 are formed by a half-etching process.

Figure 1B:
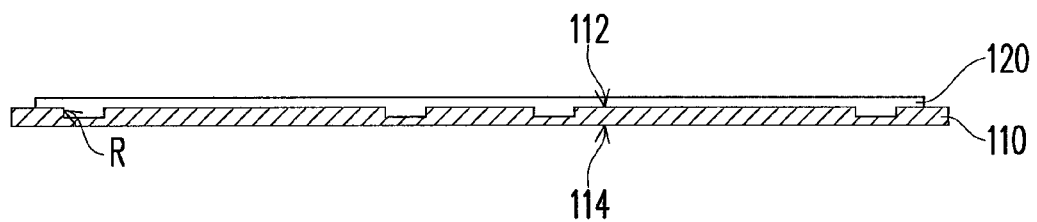

Referring to FIG. 1B, a first solder resist layer 120 is formed to entirely cover the first surface 112 of the conductive layer 110, such that the recesses R formed on the first surface 112 of the conductive layer 110 are filled with the first solder resist layer 120. In a preferred embodiment, a brown oxidation or a black oxidation process can further be performed on the conductive layer 110 to improve the surface roughness of the conductive layer 110. Accordingly, the combination between the conductive layer 110 and the first solder resist layer 120 is improved.

Figure 1C:
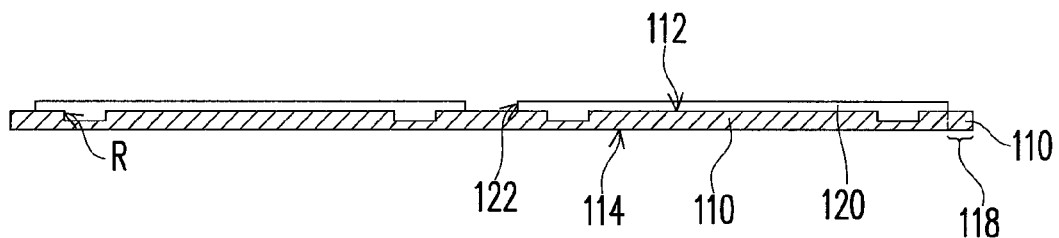

Referring to FIG. 1C, the first solder resist layer 120 is then patterned to form a plurality of first openings 122, wherein a part of the first surface 112 is exposed by the first openings 122. In other words, a plurality of first bonding pads 118 are defined by the first solder resist layer 120 formed on a part of the first surface 112.

In the present embodiment, the first solder resist layer 120 may be a solid solder resist film, and the first openings 122 are formed before or after the first solder resist layer 120 being attached onto the conductive layer 110. In an alternative embodiment, the first solder resist layer 120 may be formed by coated a liquid solder resist coating on the first surface 112 of the conductive layer 110 first, and the liquid solder resist should be cured and patterned to form the first solder resist layer 120 after being coated on the first surface 112 of the conductive layer 110. In this embodiment, the first solder resist layer 120, for example, is a photosensitive B-staged film.

Additionally, in a preferred embodiment, a plating process may be performed so as to form a plating conductive layer (not shown) on the first bonding pads 118. The plating conductive layer may be a Ni/Au stacked layer, or other suitable metal layers. It is noted that the plating conductive layer may be formed before or after the first solder resist layer 120 is formed on the conductive layer 110.

Figure 1D:
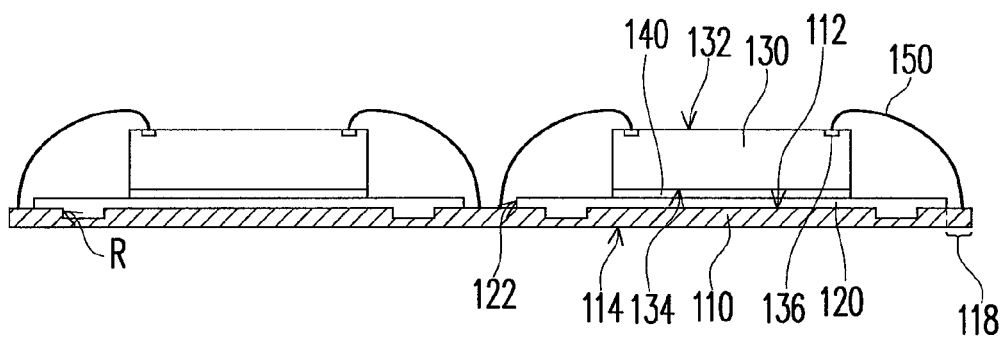

Referring to FIG. 1D, a plurality of chips 130 are adhered to the first solder resist layer 120 and a plurality of bonding wires 150 are then formed to connect the chips 130 and the conductive layer 110, wherein each chip 130 has an active surface 132, a rear surface 134 opposite to the active surface 132 and a plurality of second bonding pads 136 disposed on the active surface 132. Each chip 130 is adhered on the first solder resist layer 120 by an adhesive layer 140 between the chip 130 and the conductive layer 110 such that the first solder resist layer 120 is between the conductive layer 110 and each chip 130.

In the present embodiment, the bonding wires 150 are formed by a wire bonding process, such that each bonding wire 150 is electrically connected between a first bonding pad 118 and a second bonding pad 136. The bonding wires 150 are, for example, Au wires.

In the present embodiment, the adhesive layer 140 is a B-staged adhesive layer, for example. The B-staged adhesive layer can be obtained from 8008 or 8008HT of ABLESTIK. Additionally, the B-staged adhesive layer can also be obtained from 6200, 6201 or 6202C of ABLESTIK, or obtained from SA-200-6, SA-200-10 provided by HITACHI Chemical CO., Ltd. In an embodiment of the present invention, the B-staged adhesive layer 140 is formed on the rear surface of a wafer. When the wafer is cut, a plurality of chip 130 having the adhesive layer 140 on the rear surface 134 thereof is obtained. Therefore, the B-staged adhesive layer 140 is favorable to mass production. Additionally, the B-staged adhesive layer 140 may be formed by spin-coating, printing, or other suitable processes. More specifically, the adhesive layer 140 is formed on the rear surface 134 of the chip 130 in advance. Specifically, a wafer having a plurality of chip 130 arranged in an array is first provided. Then, a two-stage adhesive layer is formed over the rear surface 134 of the chip 130 and is partially cured by heating or UV irradiation to form the B-staged adhesive layer 140. Sometimes, the B-staged adhesive layer 140 could be formed on the first solder resist layer 120 before the chip 130 being attached on the first solder resist layer 120.

In the present embodiment, the B-staged adhesive layer 140 is fully cured after the chip 130 being attached to the first solder resist layer 120 or later by a post cured or being encapsulated by the molding compound 160.

Figure 1E:
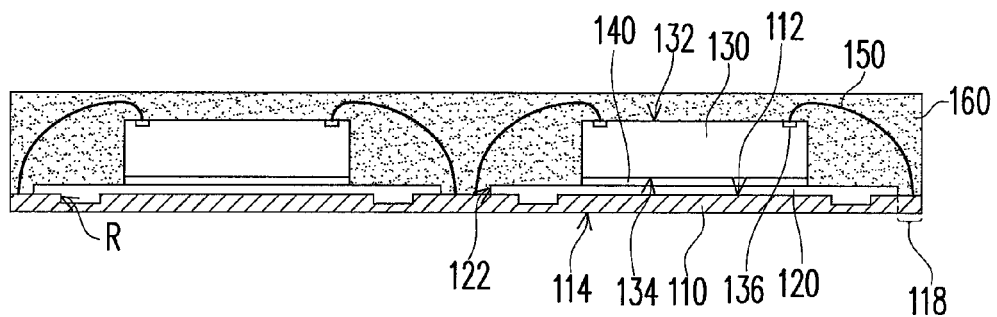

Referring to FIG. 1E, a molding compound 160 encapsulating the conductive layer 110, the first solder resist layer 120, the chip 130 and the bonding wires 150 is formed. The material of the molding compound 160 is, for example, epoxy resin.

Figure 1F:
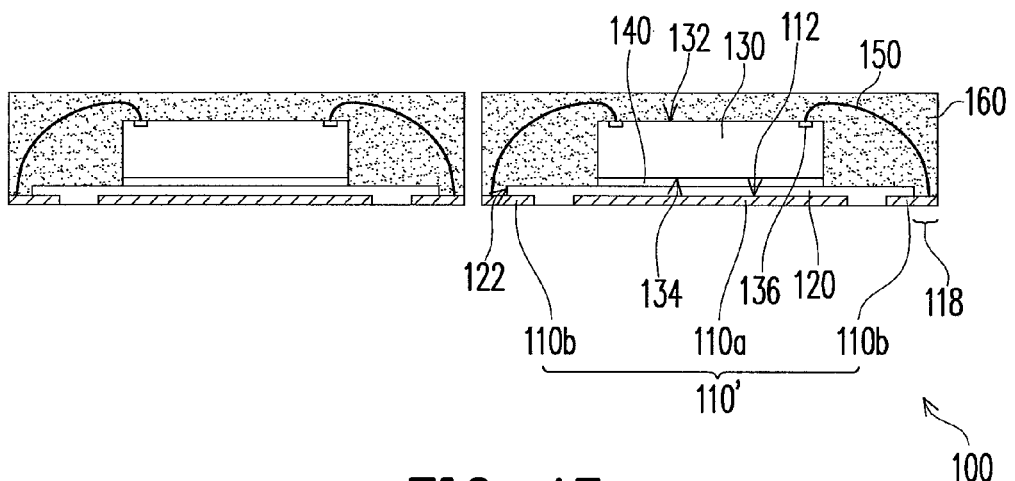

Referring to FIG. 1F, the second surface 114 of the conductive layer 110 is etched to form a patterned conductive layer 110', wherein the patterned conductive layer 110' comprises a die pad 110a and a plurality of leads 110b surrounding the die pad 110a. Then, a singulation process is performed for forming a plurality of chip packages 100. It is noted that parts of the conductive layer 110 can be removed from the second surface 114 at any manufacturing step after the first solder resist layer 120 is formed on the conductive layer 110. The removal of parts of the conductive layer 110 from the second surface 114 is, for example, performed by a back-side etching process.

As shown in FIG. 1F, the QFN chip package 100 of the present invention mainly includes a patterned conductive layer 110', a first solder resist layer 120, a chip 130, a plurality of bonding wires 150 and a molding compound 160. The patterned conductive layer 110' has a first surface 112 and a second surface 114 opposite to each other, wherein the patterned conductive layer 110' comprises a die pad 110a and a plurality of leads 110b surrounding the die pad 110a, and the first solder resist layer 120 extends from the first surface 112 of the patterned conductive layer 110' to an area between the die pad 110a and the leads 110b. The first solder resist layer 120 is disposed on the first surface 112, wherein a part of the first surface 112 is exposed by the first solder resist layer 120. The chip 130 is disposed on the first solder resist layer 120, wherein the first solder resist layer 120 is between the patterned conductive layer 110 and the chip 130. The bonding wires 150 are electrically connected to the chip 130 and the patterned conductive layer 110' exposed by the first solder resist layer 120. The molding compound 160 encapsulates the pattern conductive layer 110', the first solder resist layer 120, the chip 130 and the bonding wires 150.

Figure 1G:
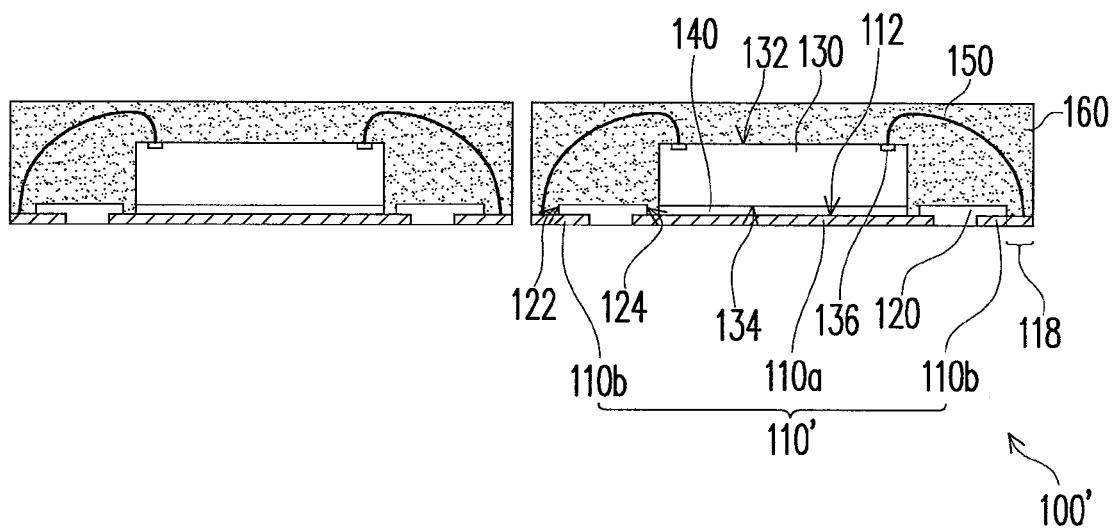

Referring to FIG. 1G, in an alternative embodiment, a plurality of second openings 124 may be formed on the first solder resist layer 120, such that each chip 130 is disposed in one of the second openings 124 and is adhered on the first surface 112 exposed by the first solder resist layer 120.

The Second Embodiment

Figure 2A:
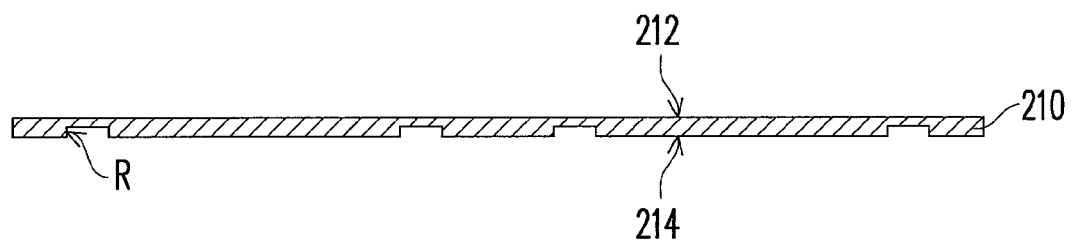
FIG. 2A to FIG. 2H are cross-sectional views schematically illustrating the manufacturing process of the QFN chip package according to the second embodiment of the present invention.

FIG. 2A to FIG. 2H are cross-sectional views schematically illustrating the manufacturing process of the QFN chip package according to the second embodiment of the present invention. Referring to FIG. 2A, a conductive layer 210 having a first surface 212 and a second surface 214 is provided, and the conductive layer 210 at predetermined regions is partially removed such that a plurality of recesses R are formed on the second surface 214 of the conductive layer 210. In the present embodiment, the recesses R on the second surface 214 are formed by a half-etching process.

Figure 2B:
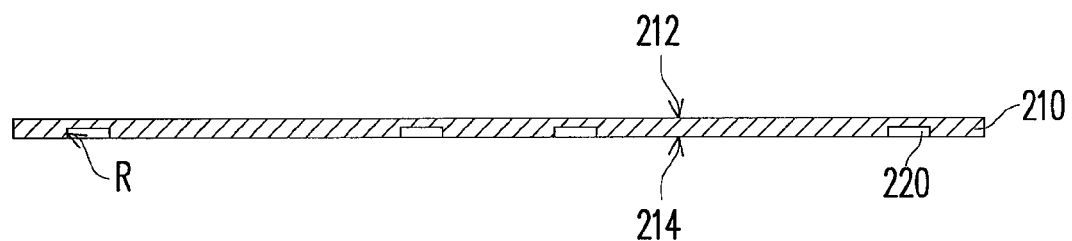
Figure 2C:
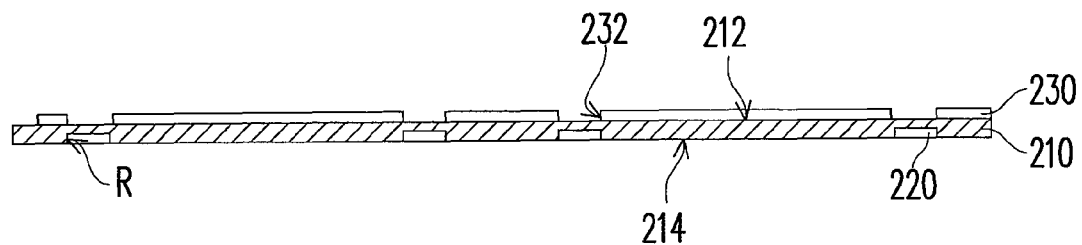

Referring to FIG. 2B, a second solder resist layer 220 is formed at the region of the recesses R formed on the second surface 214 of the conductive layer 210, such that the recesses R are filled with the second solder resist layer 220. Referring to FIG. 2C, a first solder resist layer 230 having a plurality of first openings 232 is then formed on the first surface 212 of the conductive layer 210, wherein the first openings 232 are corresponding to the half patterned structure 216 as show in FIG. 2C, and a part of the first surface 212 is exposed by the first openings 232.

Figure 2D:
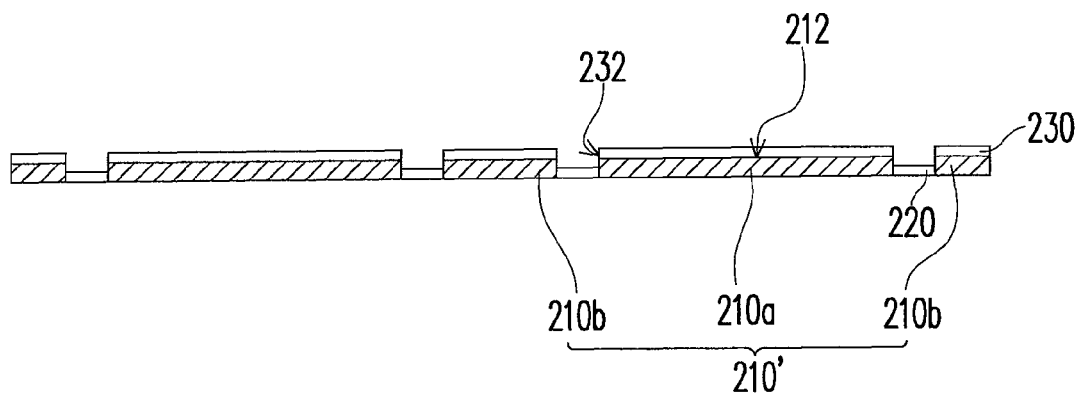
Figure 2E:
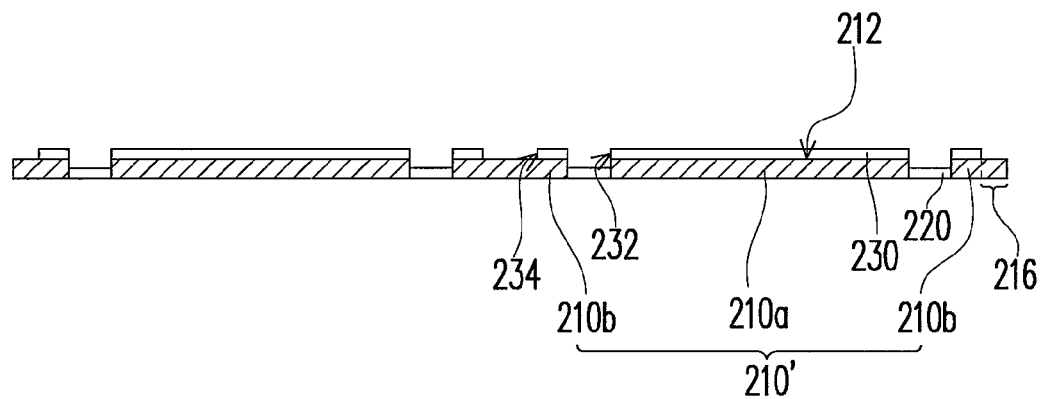

Referring to FIG. 2D, the conductive layer 210 exposed by the first openings 232 is etched for forming a patterned conductive layer 210', wherein the patterned conductive layer 210' comprises a die pad 210a and a plurality of leads 210b surrounding the die pad 210a. Referring to FIG. 2E, the first solder resist layer 230 is then patterned to form a plurality of second openings 234, wherein a part of the first surface 212 is exposed by the second openings 234. In other words, a plurality of first bonding pads 216 are defined by the first solder resist layer 230 formed on a part of the first surface 212.

In the present embodiment, the first solder resist layer 230 may be a solid solder resist film, and the first openings 232 and the second openings 234 are formed before or after the first solder resist layer 230 being attached onto the conductive layer 210. In an alternative embodiment, the first solder resist layer 230 may be formed by coated a liquid solder resist coating on the first surface 212 of the conductive layer 210 first, and the liquid solder resist should be cured and patterned to form the first solder resist layer 230 after being coated on the first surface 212 of the conductive layer 210. In this embodiment, the first solder resist layer 230, for example, is a photosensitive B-staged film.

Additionally, in a preferred embodiment, a plating process may be performed so as to form a plating conductive layer (not shown) on the first bonding pads 216. The plating conductive layer may be a Ni/Au stacked layer, or other suitable metal layers. It is noted that the plating conductive layer may be formed before or after the first solder resist layer 230 is formed on the conductive layer 210.

Figure 2F:
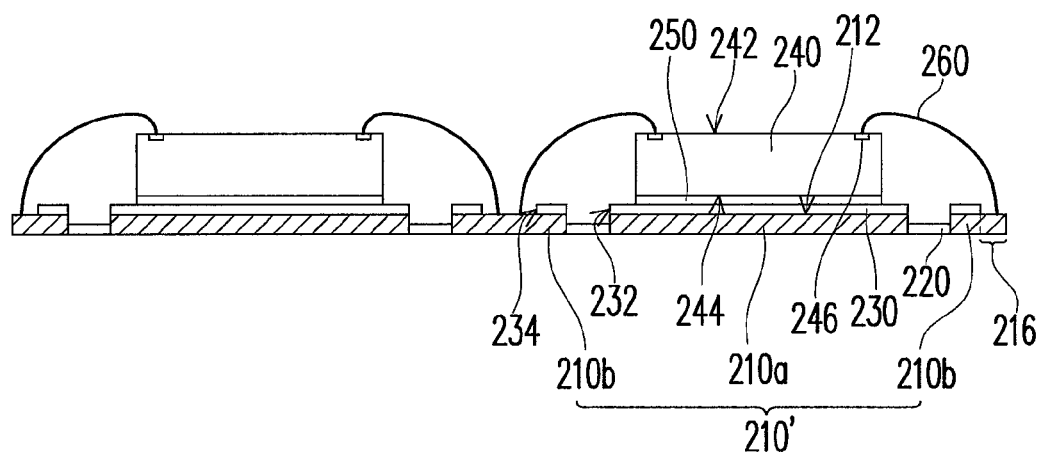

Referring to FIG. 2F, a plurality of chips 240 are adhered to the first solder resist layer 230 and a plurality of bonding wires 260 are then formed to connect the chips 240 and the patterned conductive layer 210', wherein each chip 240 has an active surface 242, a rear surface 244 opposite to the active surface 242 and a plurality of second bonding pads 246 disposed on the active surface 242. Each chip 240 is adhered on the first solder resist layer 230 by an adhesive layer 250 between the chip 240 and the patterned conductive layer 210' such that the first solder resist layer 230 is between the patterned conductive layer 210' and each chip 240.

In the present embodiment, the bonding wires 260 are formed by a wire bonding process, such that each bonding wire 260 is electrically connected between a first bonding pad 216 and a second bonding pad 246.

Figure 2G:
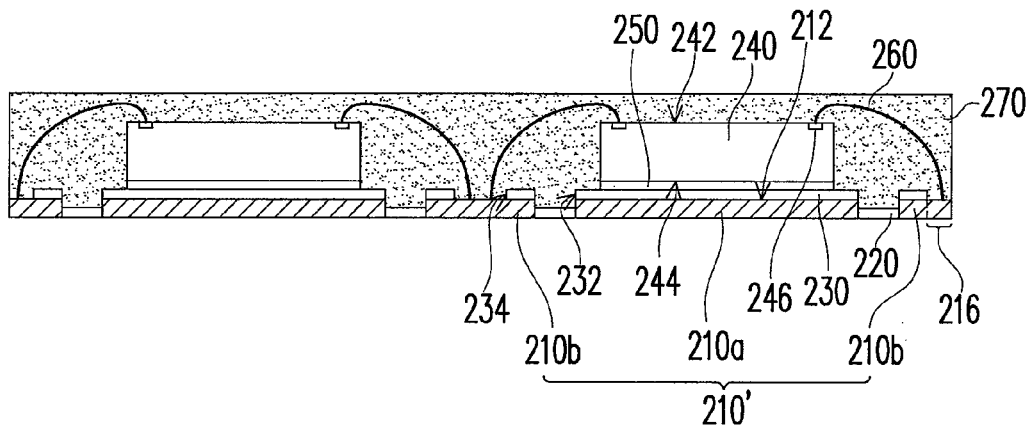
Figure 2H:
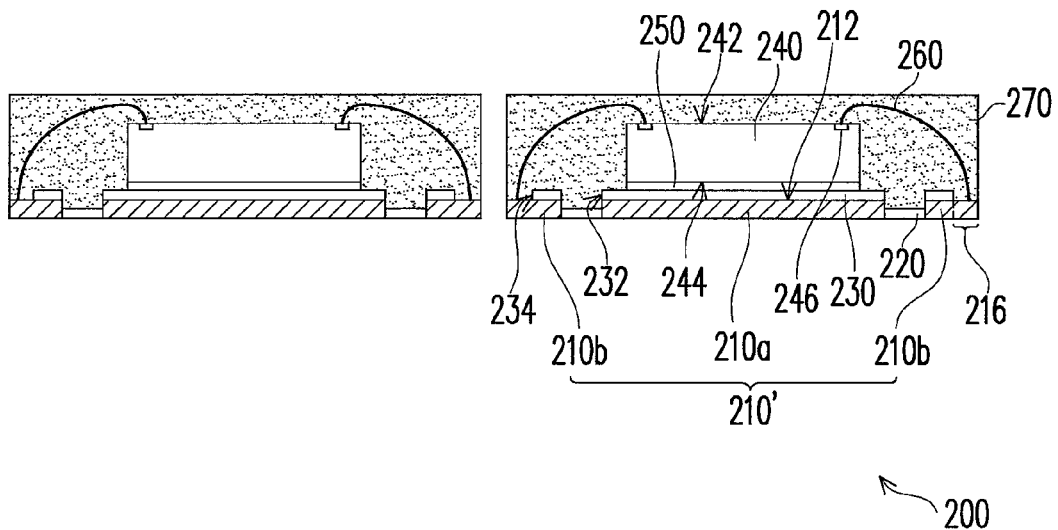

Referring to FIG. 2G, a molding compound 270 encapsulating the patterned conductive layer 210', the first solder resist layer 230, the second solder resist layer 220, the chip 240 and the bonding wires 260 is formed. Referring to FIG. 2H, a singulation process is performed for forming a plurality of chip packages 200.

Compared with the QFN chip package 100 shown in FIG. 1F, the QFN chip package 200 shown in FIG. 2H further comprises a second solder resist layer 220 disposed between the die pad 210a and the leads 210b without contacting with the first solder resist layer 230.

In an alternative embodiment, a plurality of second openings (not shown) may be formed on the first solder resist layer 230, such that each chip 240 is disposed in one of the second openings and is adhered on the first surface 212 exposed by the first solder resist layer 230.

The Third Embodiment

Figure 3A:
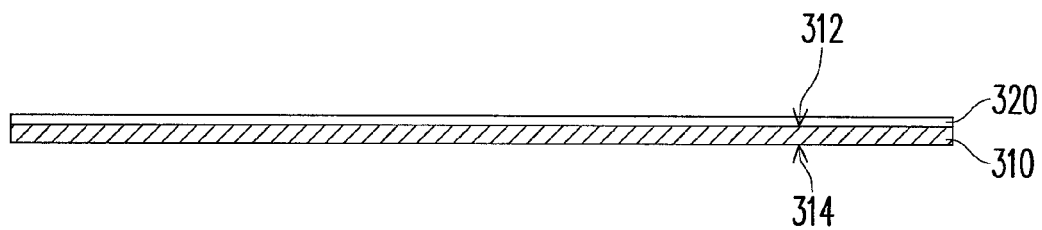
FIG. 3A to FIG. 3F are cross-sectional views schematically illustrating the manufacturing process of the QFN chip package according to the third embodiment of the present invention.

FIG. 3A to FIG. 3F are cross-sectional views schematically illustrating the manufacturing process of the QFN chip package according to the third embodiment of the present invention. Referring to FIG. 3A, a first solder resist layer 320 and a conductive layer 310 having a first surface 312 and a second surface 314 are provided, and the first solder resist layer 320 is formed on the first surface 312 by molding or printing.

Figure 3B:
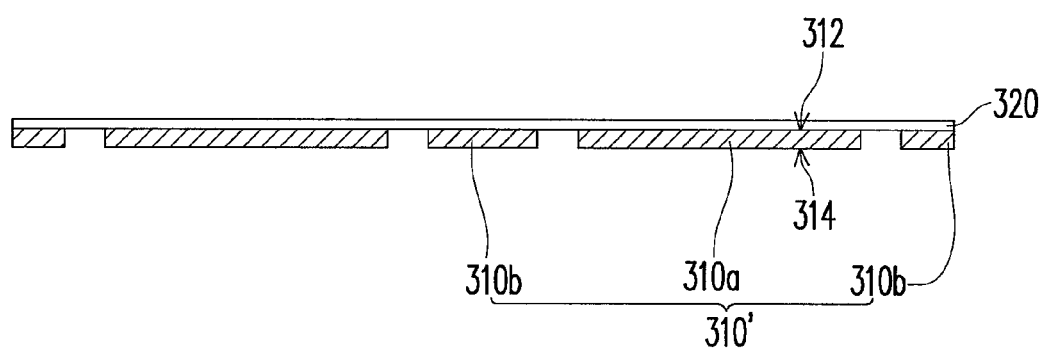

Referring to FIG. 3B, the conductive layer 310 is then patterned through a photolithography and etching process to form a patterned conductive layer 310', wherein the patterned conductive layer 310' comprises a die pad 310a and a plurality of leads 310b surrounding the die pad 310a.

Figure 3C:
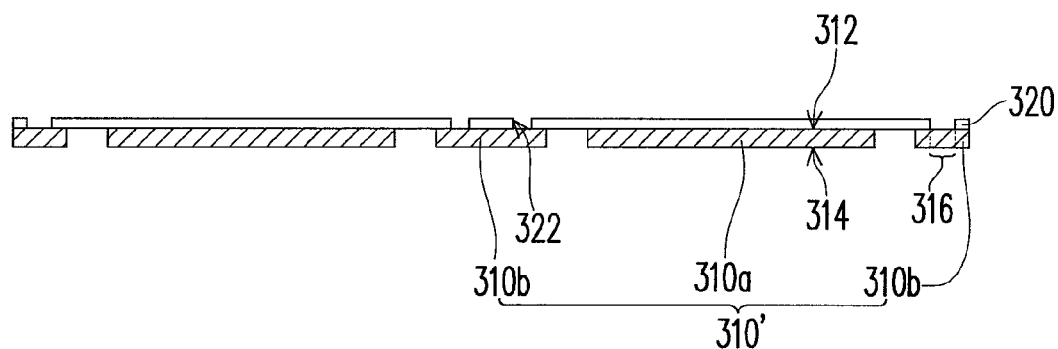

Referring to FIG. 3C, the first solder resist layer 320 is then patterned to form a plurality of first openings 322, wherein a part of the first surface 312 is exposed by the first openings 322. In other words, a plurality of first bonding pads 316 are defined by the first solder resist layer 320 formed on a part of the first surface 312. It is noted that sequence of the patterning processes for forming the patterned conductive layer 310' and the first openings 322 of the first solder resist layer 320 is not limited in the present invention.

In the present embodiment, the first solder resist layer 320 may be a solid solder resist film, and the first openings 322 are formed before or after the first solder resist layer 320 being attached onto the conductive layer 310. In an alternative embodiment, the first solder resist layer 320 may be formed by coated a liquid solder resist coating on the first surface 312 of the conductive layer 310 first, and the liquid solder resist should be cured and patterned to form the first solder resist layer 320 after being coated on the first surface 312 of the conductive layer 310. In this embodiment, the first solder resist layer 320, for example, is a photosensitive B-staged film.

Additionally, in a preferred embodiment, a plating process may be performed so as to form a plating conductive layer (not shown) on the first bonding pads 316. The plating conductive layer may be a Ni/Au stacked layer, or other suitable metal layers. It is noted that the plating conductive layer may be formed before or after the first solder resist layer 320 is formed on the conductive layer 310.

Figure 3D:
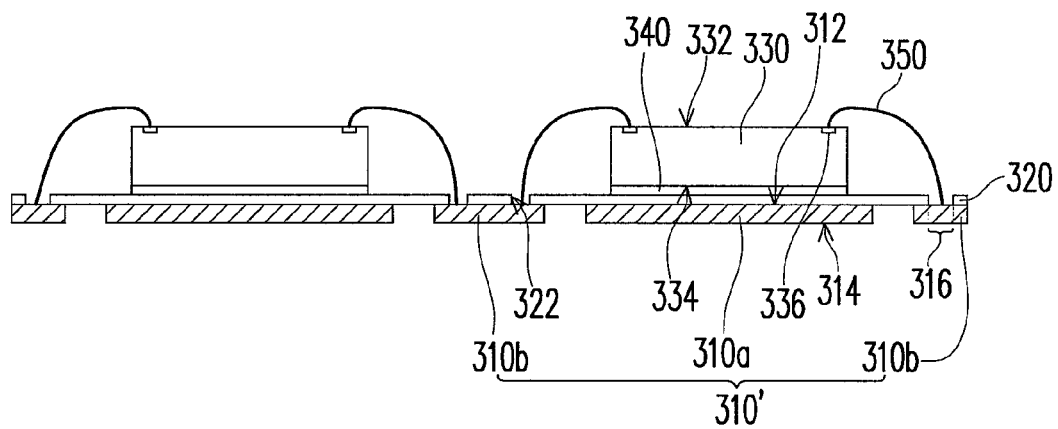

Referring to FIG. 3D, a plurality of chips 330 are adhered to the first solder resist layer 320 and a plurality of bonding wires 360 are then formed to connect the chips 330 and the patterned conductive layer 310', wherein each chip 330 has an active surface 332, a rear surface 334 opposite to the active surface 332 and a plurality of second bonding pads 336 disposed on the active surface 332. Each chip 330 is adhered on the first solder resist layer 320 by an adhesive layer 340 between the chip 330 and the patterned conductive layer 310' such that the first solder resist layer 320 is between the patterned conductive layer 310' and each chip 330.

In the present embodiment, the bonding wires 360 are formed by a wire bonding process, such that each bonding wire 360 is electrically connected between a first bonding pad 316 and a second bonding pad 336.

Figure 3E:
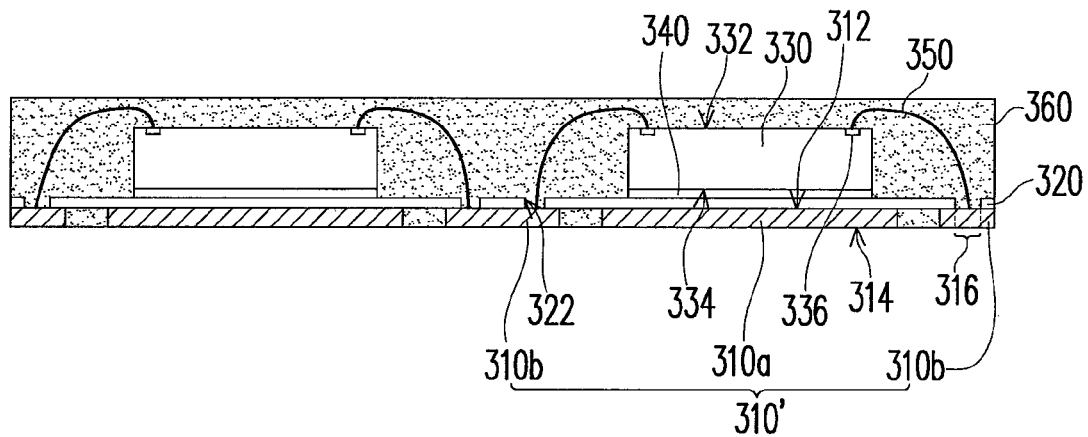
Figure 3F:
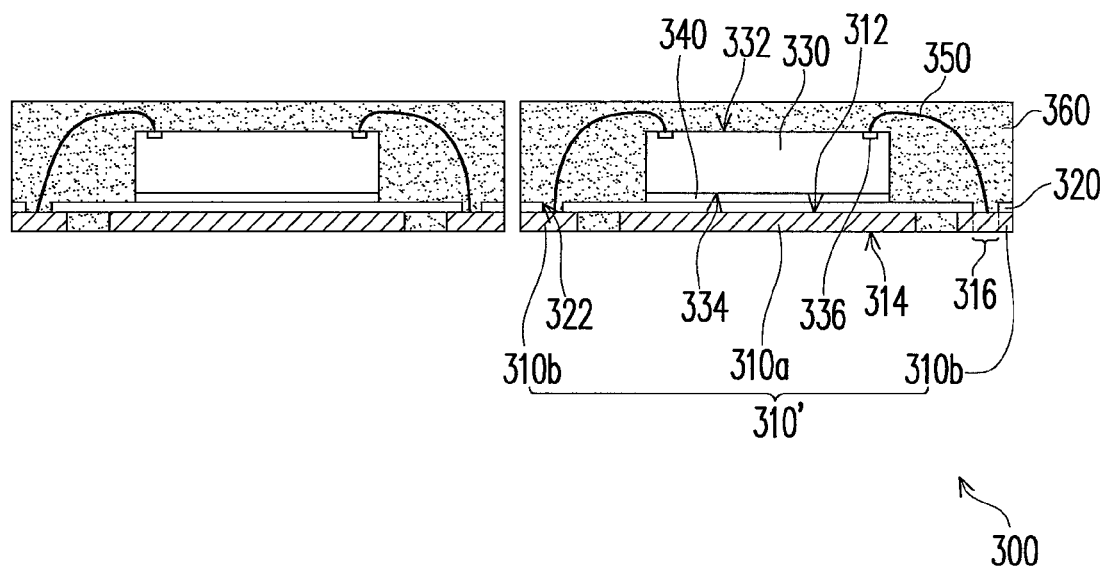

Referring to FIG. 3E, a molding compound 360 encapsulating the patterned conductive layer 310', the first solder resist layer 320, the chip 330 and the bonding wires 350 is formed. Referring to FIG. 3F, a singulation process is performed for forming a plurality of chip packages 300.

Compared with the QFN chip package 100 shown in FIG. 1F, the first solder resist layer 320 of the QFN chip package 300 shown in FIG. 3F does not extends from the first surface 312 of the patterned conductive layer 310' to an area between the die pad 310a and the leads 310b, and the area between the die pad 310a and the leads 310b is filled with the molding compound 360.

In an alternative embodiment, a plurality of second openings (not shown) may be formed on the first solder resist layer 320, such that each chip 330 is disposed in one of the second openings and is adhered on the first surface 312 exposed by the first solder resist layer 320.

Compared with the conventional QFN chip package, the QFN chip package of the present invention has a solder resist layer to enhance the structure strength of the QFN chip package, such that the thickness of the patterned conductive layer can be decreased. Additionally, the overall thickness of the QFN chip package is decreased and the production cost is lowered, such that the throughput is improved in the present invention.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A Quad Flat Non-leaded (QFN) chip package, comprising:
    a patterned conductive layer, having a first surface and a second surface opposite to each other, wherein the patterned conductive layer comprises a die pad and a plurality of leads surrounding the die pad;
    a first solder resist layer, disposed on the first surface, wherein a part of the first surface is exposed by the first solder resist layer;
    a chip, disposed on the first solder resist layer, wherein the first solder resist layer is between the patterned conductive layer and the chip;
    a plurality of bonding wires, electrically connected to the chip and the patterned conductive layer exposed by the first solder resist layer; and
    a molding compound, encapsulating the pattern conductive layer, the first solder resist layer, the chip and the bonding wires.

2. The QFN chip package as claimed in claim 1, wherein the first solder resist layer extends from the first surface of the patterned conductive layer to an area between the die pad and the leads.

3. The QFN chip package as claimed in claim 1, further comprising a second solder resist layer disposed between the die pad and the leads without contacting with the first solder resist layer.

4. The QFN chip package as claimed in claim 1, wherein the chip has an active surface, a rear surface opposite to the active surface and a plurality of bonding pads disposed on the active surface, and the rear surface of the chip contacts with the first solder resist layer.

5. The QFN chip package as claimed in claim 1, further comprising an adhesive layer disposed between the first solder resist layer and the chip.

6. The QFN chip package as claimed in claim 5, wherein the adhesive layer comprises a B-staged adhesive layer.

7. A Quad Flat Non-leaded (QFN) chip package, comprising:
    a patterned conductive layer, having a first surface and a second surface opposite to each other, wherein the patterned conductive layer comprises a die pad and a plurality of leads surrounding the die pad;
    a first solder resist layer, disposed on the first surface, wherein a part of the first surface is exposed by the first solder resist layer;
    a chip, disposed on a portion of the first surface exposed by the first solder resist layer;
    a plurality of bonding wires, electrically connected to the chip and the patterned conductive layer exposed by the first solder resist layer; and
    a molding compound, encapsulating the pattern conductive layer, the first solder resist layer, the chip and the bonding wires.

8. The QFN chip package as claimed in claim 7, wherein the first solder resist layer extends from the first surface of the patterned conductive layer to the area between the die pad and the leads.

9. The QFN chip package as claimed in claim 7, further comprising a second solder resist layer disposed between the die pad and the leads.

10. The QFN chip package as claimed in claim 9, further comprising the second solder resist layer disposed between the die pad and the leads without contacting with the first solder resist layer.

11. The QFN chip package as claimed in claim 7, wherein the chip has an active surface, a rear surface opposite to the active surface and a plurality bonding pads disposed on the active surface, and the rear surface of the chip contacts with the first surface of the patterned conductive layer.

12. The QFN chip package as claimed in claim 7, further comprising an adhesive layer disposed between the patterned conductive layer and the chip.

13. The chip package as claimed in claim 12, wherein the adhesive layer comprises a B-staged adhesive layer.

* * * * *